(12) United States Patent
Li

(10) Patent No.: US 6,759,341 B1
(45) Date of Patent: Jul. 6, 2004

(54) WAFERING METHOD COMPRISING A PLASMA ETCH WITH A GAS EMITTING WAFER HOLDER

(75) Inventor: Chih-Yang Li, Mountain View, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/412,978

(22) Filed: Apr. 9, 2003

(51) Int. Cl.[7] .............................................. H01L 21/302
(52) U.S. Cl. ...................... 438/716; 438/707; 438/706; 438/710
(58) Field of Search ................................ 438/459, 460, 438/465, 706, 707, 710, 716, 784

(56) References Cited

U.S. PATENT DOCUMENTS

| | | | |
|---|---|---|---|
| 4,668,366 A | 5/1987 | Zarowin | |
| 5,254,830 A | 10/1993 | Zarowin et al. | |
| 6,095,582 A | 8/2000 | Siniaguine et al. | |
| 6,139,678 A | 10/2000 | Siniaguine | |
| 6,168,697 B1 | 1/2001 | Siniaguine et al. | |
| 6,184,060 B1 | 2/2001 | Siniaguine | |
| 6,203,661 B1 | 3/2001 | Siniaguine et al. | |
| 6,287,976 B1 | 9/2001 | Siniaguine et al. | |
| 6,294,469 B1 | 9/2001 | Kulkarni et al. | |
| 6,398,823 B1 | 6/2002 | Siniaguine et al. | |
| 6,402,843 B1 | 6/2002 | Siniaguine et al. | |
| 6,427,991 B1 | 8/2002 | Kao | |
| 6,448,153 B2 * | 9/2002 | Siniaguine et al. | 438/460 |
| 2002/0187595 A1 | 12/2002 | Walitzki et al. | |

FOREIGN PATENT DOCUMENTS

WO   WO 02/41355   5/2002

OTHER PUBLICATIONS

Wolf, Stanley; Tauber, Richard N. "Silicon Processing for the VLSI ERA, vol. 1: Process Technology" 1986 by Lattice Press, Sunset Beach, California; pp. 23–26.

* cited by examiner

Primary Examiner—Richard Elms
Assistant Examiner—Brad Smith
(74) Attorney, Agent, or Firm—Michael Shenker; MacPherson Kwok Chen & Heid LLP

(57) ABSTRACT

To reduce the edge roll off in a semiconductor wafering process, the wafer (110) is subject to a plasma etch with an edge underetch. The edge underetch is achieved by means of a wafer holder (410) that emits gas towards the wafer (e.g. a gas vortex) to draw the wafer towards the holder's body (460). The plasma impinges on the wafer surface (110.1) opposite to the body. Some of the gas emitted by the holder wraps around the wafer edge and dilutes the etchant near the wafer edge. Consequently, the etch proceeds slower near the edge (the edge is underetched). In some embodiments, the wafer is rotated around an axis (440) passing through the wafer to increase the underetch.

13 Claims, 5 Drawing Sheets

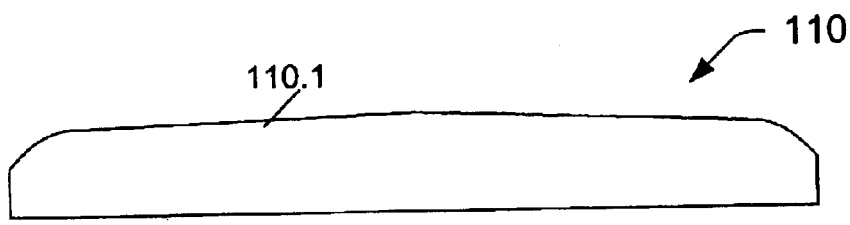
FIG. 1 PRIOR ART
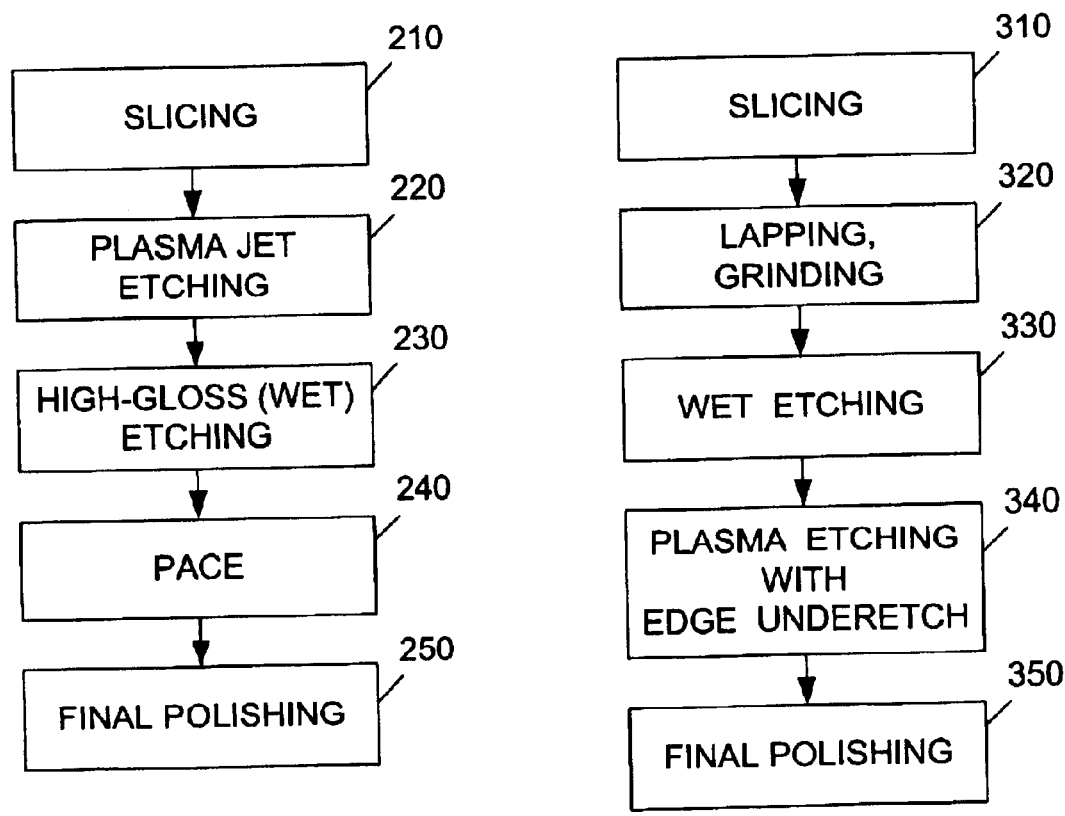
FIG. 2 PRIOR ART
FIG. 3

WAFERING METHOD COMPRISING A PLASMA ETCH WITH A GAS EMITTING WAFER HOLDER

BACKGROUND OF THE INVENTION

The present invention relates to manufacture of semiconductor wafers (the process known as "wafering"). In particular, the present invention relates to use of plasma etching to improve the wafer's flatness and the thickness uniformity.

Manufacture of silicon wafers starts with growing a monocrystalline silicon ingot. After initial testing and grinding, the ingot is sawed into slices, and each slice is processed to obtain a uniformly thick wafer with smooth flat surfaces. Typical processing includes:

1. Lapping and grinding of the wafer to remove any saw marks left by the ingot sawing operation. This step also serves to increase the wafer flatness and the thickness uniformity.

2. A wet etch to remove the surface damage caused by the lapping and grinding.

3. After the wet etch, chemical mechanical polishing (CMP) of one or both surfaces or the wafer to produce a highly reflective, scratch and damage free surface suitable for photolithography.

See S. Wolf et al., "Silicon Processing for the VLSI Era", vol. 1 ("Process Technology"), 1986, pages 23–26, which are incorporated herein by reference.

While the lapping, the grinding and the wet etch increase the overall flatness and thickness uniformity, these operations introduce non-uniformity near the wafer edges. Silicon is removed faster near the edges, which results in an "edge roll off". See FIG. 1. Wafer 110 is thinner near the edges, with the top surface 110.1 sloping down near the edges. (The edge roll off may also be present at the bottom surface of the wafer, this is not shown in FIG. 1.) If the roll off is high, a longer polishing operation (CMP) will be needed to reduce the roll off to an acceptable value. Since the polishing rate is low, it is desirable to reduce the roll off before the polishing.

FIG. 2 illustrates an alternate processing sequence described in U.S. Pat. No. 6,294,469 issued Sep. 25, 2001 to Kulkarni et al. The ingot is sliced (step 210). Then the wafer is subjected to "plasma jet etching" (step 220) to remove the sub-surface damage caused by the slicing operation. Then a wet etch is performed ("high-gloss etching", step 230) to smoothen the wafer. This is followed by "plasma assisted chemical etching" (PACE) at step 240. PACE involves calculating a point-by-point thickness profile of the wafer, and determining the amount of material to be removed at each point of the wafer surface. The calculated amount of material determines the plasma "dwell time" at each point of the wafer. Then a plasma etch is performed in an apparatus capable to control the plasma in accordance with the calculated dwell times. See also U.S. Pat. No. 5,254,830 issued Oct. 19, 1993 to Zarowin et al.

SUMMARY

This section summarizes some features of the invention. Other features are described in subsequent sections. The invention is defined by the appended claims.

The inventor has observed that the edge roll off can be reduced by a plasma etch if the wafer is held in a particular type of a wafer holder. The plasma etch may or may not be a point-to-point etch, and no point-to-point dwell times are calculated in some embodiments. The wafer holder emits a gas flow (e.g. a vortex of gas) towards the wafer. The gas flow causes a low pressure zone to develop between the holder's body and the wafer. Due to the low pressure, the wafer is held adjacent to the holder's body. The plasma impinges on the wafer surface opposite to the surface facing the body. Some of the gas emitted by the holder wraps around the wafer and dilutes the etchant near the edge. Consequently, the etch proceeds slower near the edge (the wafer is underetched near the edge).

In some embodiments, the wafer rotates around an axis passing through the wafer to make the underetch more uniform along the edge.

Other features and advantages of the invention are described below. The invention is defined by the appended claims.

BRIEF DESCRIPTION OF THE DRAWINGS

FIG. 1 is a side view of a prior art silicon wafer.

FIG. 2 is a flowchart of a prior art wafering process.

FIG. 3 is a flowchart of a wafering process according to one embodiment of the present invention.

DESCRIPTION OF SOME EMBODIMENTS

The embodiments described in this section illustrate but do not limit the invention. The invention is not limited to particular sequences of steps, equipment, dimensions and process parameters. The invention is defined by the appended claims.

FIG. 3 is a process flowchart for one embodiment of the present invention. Steps 310 (ingot slicing), 320 (lapping, grinding), 330 (wet etching) can be performed as in the Wolf reference cited above. Alterative, the lapping 320 can be replaced with the plasma jet etching 220 (FIG. 2). Other types of processing, known or to be invented, are also possible.

Then step 340 is performed, "plasma etching with edge underetch". The wafer is etched slower near the edge to reduce an edge roll off. In some embodiments, this step also increases the wafer flatness in areas not adjacent to the edge. In some embodiments, this step is effective in removing the surface damage caused by lapping or grinding. In some embodiments, this step is performed on both sides of the wafer, and the wet etching step 330 is omitted. In other embodiments, only one wafer side is processed at step 340; the step 330 may or may not be omitted.

Step 350 (final polishing) can be identical to step 250. Steps 340, 350 can be performed on only one side or both sides of the wafer.

Figure 4A:
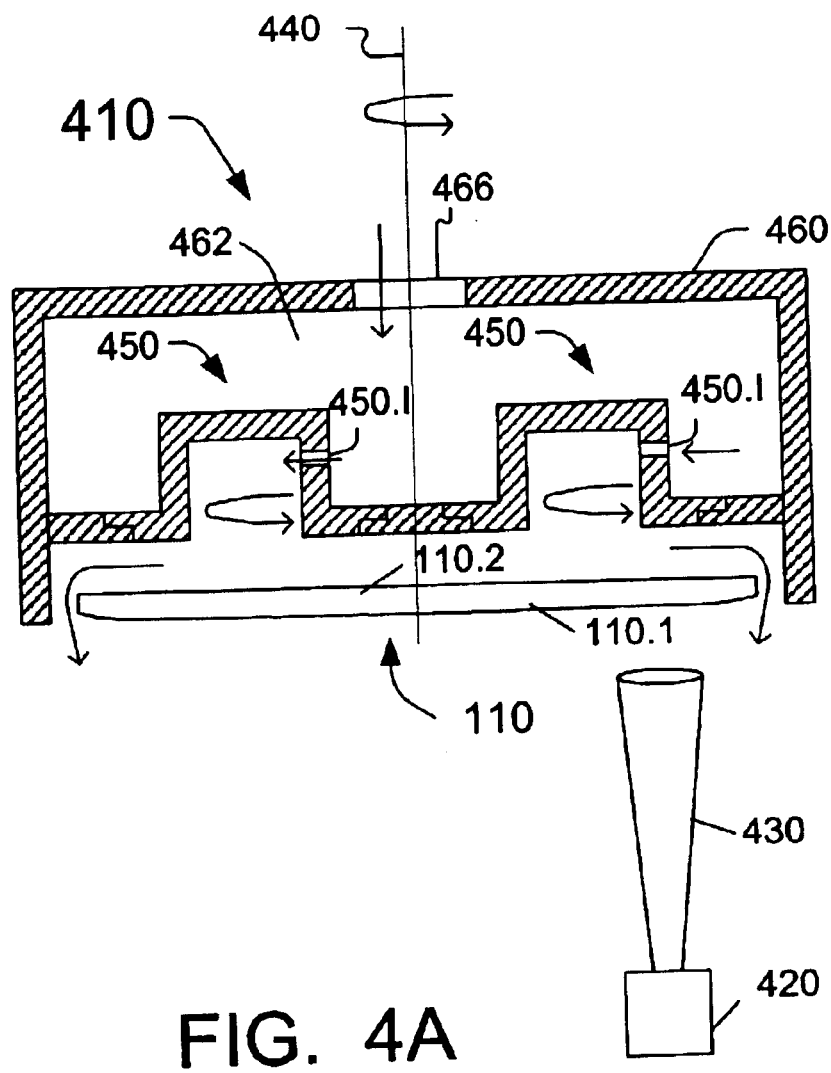
FIG. 4A is a side cross sectional view of a wafer holder used in one embodiment of the present invention.

FIG. 4A shows a cross section of a wafer holder 410 employed in one embodiment for the plasma etch of step 340. Wafer surface 110.1 (the surface exposed to the plasma) faces down. (This is not generally necessary, the surface 110.1 may face upward.) Plasma generator 420 emits a plasma jet 430 flowing up and impinging on wafer surface 110.1. Plasma 430 may contain ionized nitrogen mixed with $CF_4$ or some other etchant. The etchant may or may not be ionized. The etch is performed at a fairly high pressure, e.g. atmospheric pressure. See e.g. U.S. Pat. No. 6,184,060 issued Feb. 6, 2001 to Siniaguine and incorporated herein by reference. In this embodiment, the plasma footprint on the wafer is smaller than the wafer (the plasma does not cover the entire surface 110.1). Therefore, holder 410 and plasma generator 430 move relative to each other to ensure that the whole surface 110.1 is processed. In addition, the wafer 110 may rotate around its central axis 440. See U.S. Pat. No. 6,139,678 issued Oct. 31, 2000, U.S. Pat. No. 6,287,976 issued Sep. 11, 2001, and PCT publication WO 02/41355 published May 23, 2002, all incorporated herein by reference. In other embodiments, the plasma footprint is larger than the wafer.

Figure 4B:
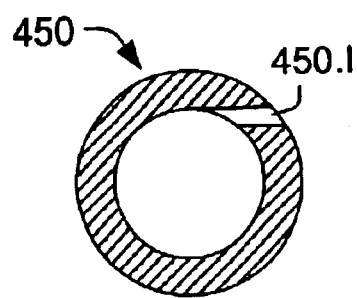
FIG. 4B is a top cross sectional view of a vortex chuck used in the holder of FIG. 4A.

A number of cylindrical vortex chucks 450 are mounted in the bottom surface of the wafer holder's body 460. FIG. 4B is a top cross sectional view of a chuck 450. The chuck has a tangential inlet 450.1 on a side, and has an outlet on the bottom (the outlet faces the wafer). Gas (e.g. air or nitrogen) is supplied under pressure into a cavity 462 in body 460 through an opening 466 at the top of the holder. The gas enters the chucks 450 from cavity 462 through inlets 450.1. The inner cylindrical surface of the chuck shapes the gas flow into a vortex. The vortices emerge from the chucks' outlets adjacent to the wafer's top surface 110.2. The low pressure zone present near the center of each vortex causes the wafer to be attracted to the body 460. At the same time, the gas between the older and the wafer prevents the wafer from contacting the body 460. The gas flows sidewise between the wafer and the body 460 to the wafer edge. Some of the gas flows down around the edge and dilutes the plasma 430 when the plasma processes the wafer area near the edge. Consequently, the wafer area near the edges is underetched.

The amount of underetch depends on the gas flow rate, the geometry of the holder, the movement of the holder relative to the plasma, and possibly other parameters. The inventor has found that in some embodiments, the edge underetch increases with the gas flow rate. If the gas flow rate is low, the underetch may be close to zero. A suitable gas flow rate value can be found experimentally for a particular process.

Wafer rotation around the axis 440 improves the underetch uniformity.

The invention is not limited to the embodiment of FIGS. 4A, 4B. Other wafer holder embodiments are described in U.S. Pat. No. 6,168,697 issued Jan. 2, 2001; U.S. Pat. No. 6,203,661 issued Mar. 20, 2001; U.S. Pat. No. 6,402,843 issued Jun. 11, 2002; U.S. Pat. No. 6,398,823 issued Jun. 4, 2002; U.S. Pat. No. 6,427,991 issued Aug. 6,2002; and U.S. patent application Ser. No. 09/877,366 filed Jun. 8, 2001, all of which are incorporated herein by reference.

Figure 5:
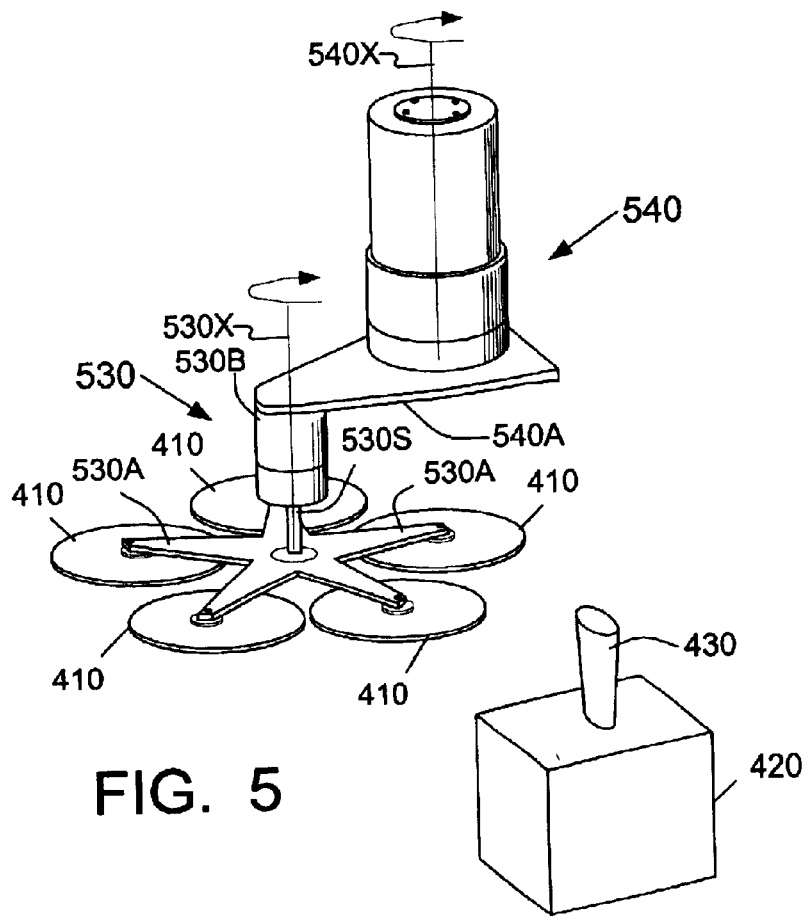
FIG. 5 is a perspective view of a plasma etching system used in one embodiment of the present invention.

FIG. 5 shows an exemplary plasma processing system used in some embodiments of the invention. Similar systems are described in U.S. Pat. No. 6,139,678 issued Oct. 31, 2000; U.S. Pat. No. 6,287,976 issued Sep. 11, 2001; and PCT application WO 02/41355 published May 23, 2002, all of which are incorporated herein by reference. Five wafer holders 410 are arranged on a carrousel. The wafers, not shown in FIG. 5, are below the holders 410. Each holder 410 is rigidly attached to a respective arm 530A of an angle drive 530. The arms 530A are part of a star-shaped structure rigidly connected at its center to a vertical shaft 530S rotated around its vertical axis 530X by a motor (not shown) inside body 530B of drive 530. The shaft 530S rotates the wafers around the axis 530X. Body 530B is rigidly attached to an arm 540A of an angle drive 540. Drive 540 rotates the arm around a vertical axis 540X. A control system (not shown), possibly a computer, controls the drives 530, 540 and the plasma generator 420.

Figure 6A:
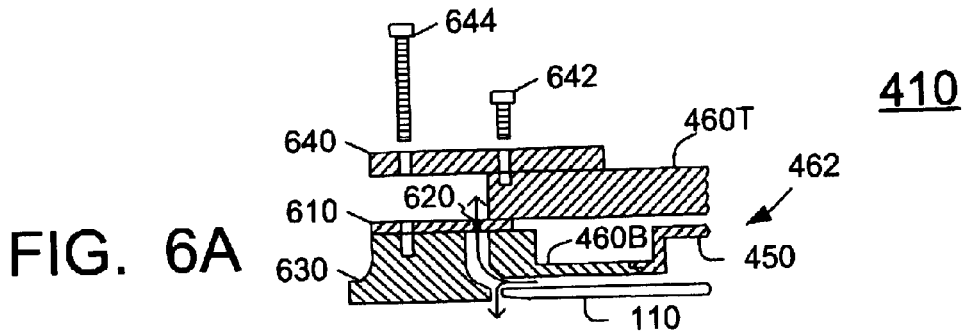
FIGS. 6A, 6B are side cross sectional views of a wafer holder used in one embodiment of the present invention.
Figure 6B:
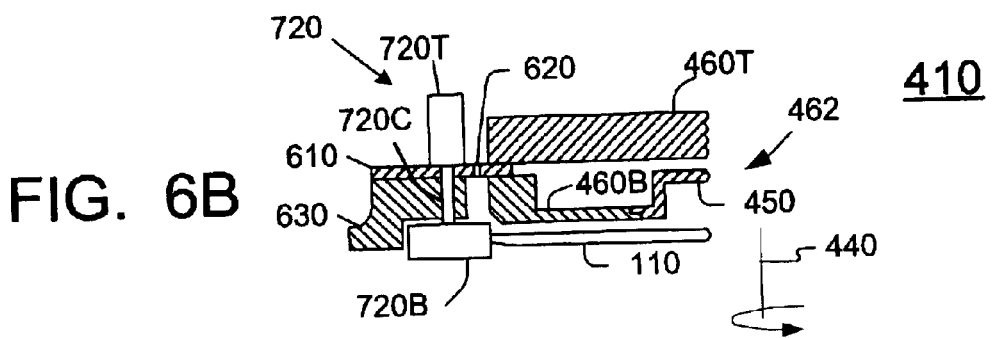
Figure 7:
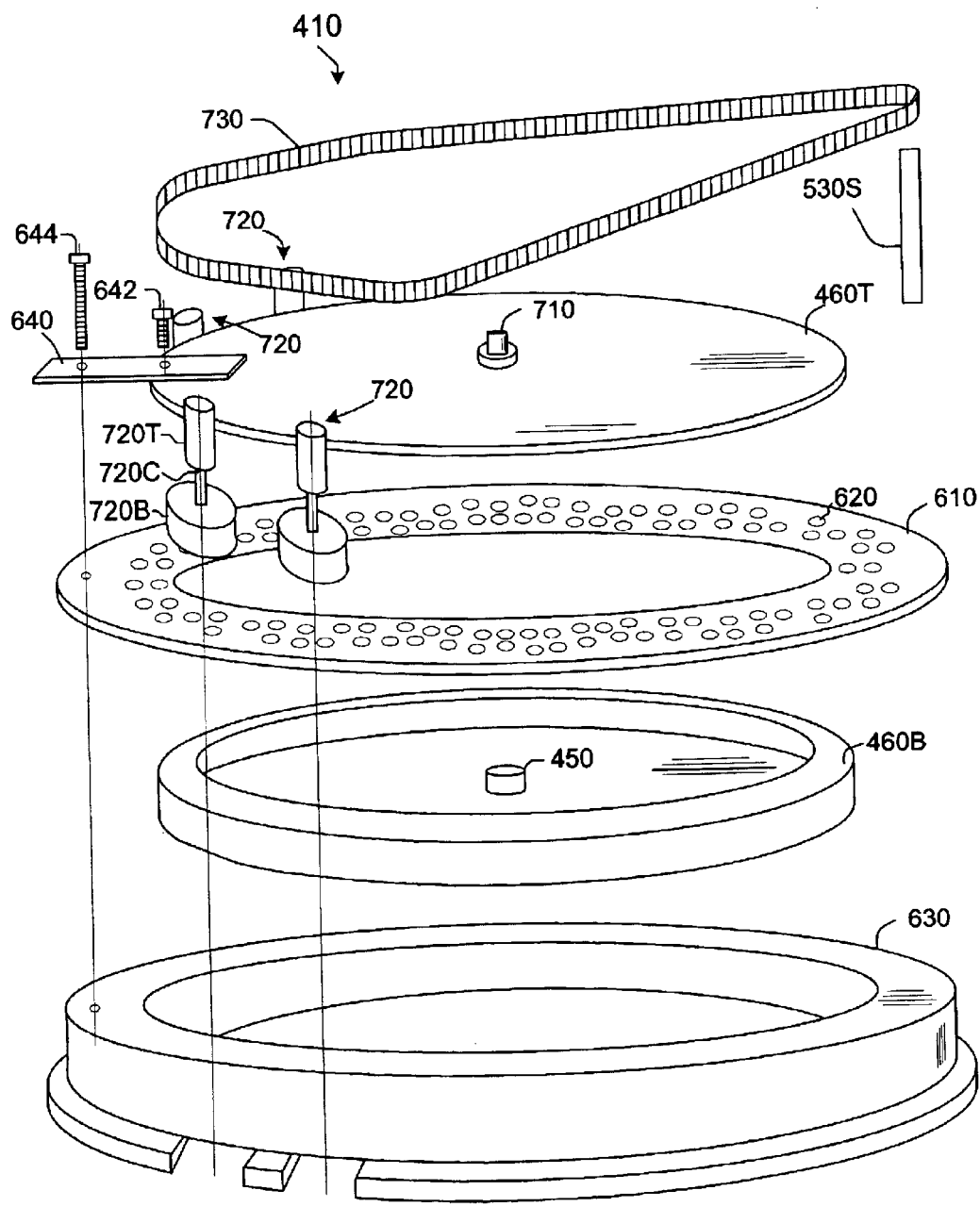
FIG. 7 is an exploded view of the wafer holder of FIGS. 6A, 6B.

FIGS. 6A, 6B are cross sectional views showing some features of another wafer holder 410 suitable for the present invention. This wafer holder may be used with the system of FIG. 5 or with other systems. FIG. 7 is an exploded perspective view of the older of FIGS. 6A, 6B.

The holder's body 460 includes a top plate 460T and a bottom plate 460B which bound the cavity 462. Chucks 450 are mounted in the bottom plate 460B. Only one chuck is shown, but any number of chucks may be present. Annular baffle 610 is mounted between the top and bottom plates. Small holes 620 are made densely throughout the baffle 610. The gas emerging from the chucks 450 flows to the edge of the wafer. Then some of the gas flows down and dilutes the plasma as described above, and some of the gas flows up through openings 620. Some of the openings can be plugged during the chuck assembly to regulate the amount of gas that flows up at any point of the wafer holder's circumference. This can be done to increase the wafer edge processing uniformity and also to regulate the amount of gas flowing down.

Annular brim 630 surrounds the bottom plate 460B. Brim 630 improves the etch uniformity as described in U.S. Pat. No. 6,203,661 issued Mar. 20, 2001, incorporated herein by reference. Brim 630 is in the path of the horizontal gas flow emerging from between the bottom plate 460B and the wafer. The brim deflects some of the gas downward and some of the gas up towards the openings 620.

Mounting ears 640 hold together the plates 460T and 460B, the baffle 610 and the brim 630. Only one ear 640 is shown for simplicity, but any number of ears can be present (six ears are used in one embodiment). The ears 640 are positioned around the circumference of the holder. Each ear 640 is mounted with two screws 642, 644. Screw 642 rigidly attaches the ear to plate 460T. Screw 644 to is threaded through the ear 640, baffle 610 and brim 630 to rigidly hold the three pieces together. This attachment technique is not limiting. The cross sectional plane of FIG. 6A passes through one ear 640, but the cross sectional plane of FIG. 6B does not pass through a ear.

As shown in FIG. 7, a hollow vertical shaft 710 is attached to the center of top plate 460T. This shaft is also attached to a corresponding arm 530A. The passage inside the shaft 710 communicates with an opening (not shown) in the top plate 460T and with another opening (not shown) in the corresponding arm 530A to conduct gas to the cavity 462. The opening in top plate 460T is similar to opening 466 of FIG. 4A.

As indicated in FIG. 5, each holder 410 rotates around the axis 530X of shaft 530S, and the shaft 530S rotates around the axis 540X. In one embodiment, axis 540X and plasma generator 420 are stationary. A third rotational motion is conveyed to each wafer 110 as described in the aforementioned PCT application WO 02/41355. For example, the holder may have four rotatable pins 720 (FIG. 7), each rotating around its vertical axis. Each pin 720 has a top cylindrical portion 720T, a bottom cylindrical portion 720B, and a cylindrical center shaft 720C. Shaft 720C passes through openings in baffle 610 and brim 630, and can freely rotate in these openings. The top and bottom portions 720T, 720B are wider than the openings in baffle 610 and brim 630 in which the shaft 720C is located. The bottom portion 720B is located in a recess in brim 630. The four pins are positioned on a wafer side opposite to the axis 53OX. Due to the rotation around the axes 530X and/or 540X, the wafer 110 is centrifugally pressed against the bottom portions 720B.

Link 730 (e.g. a belt or a chain) is tightly wrapped around the shaft 530S and the top portions 720T of the four pins 720. The rotation of shaft 530S around the axis 530X causes the link 730 to travel around the shaft without slippage, and the link drives the pins 720. Consequently, each pin 720 rotates around its axis. The coupling between the pins' bottom portions 720B and the wafer 110 causes the wafer to rotate around an axis 440 defined by the position of pins 720 and the wafer geometry. Axis 440 passes through the wafer. Typically, the wafer is circular except for flats at the wafer periphery, and the axis 440 is a vertical axis passing through the center of the wafer or near the center.

Pins 720 and link 730 are not shown in FIG. 5.

Figure 8:
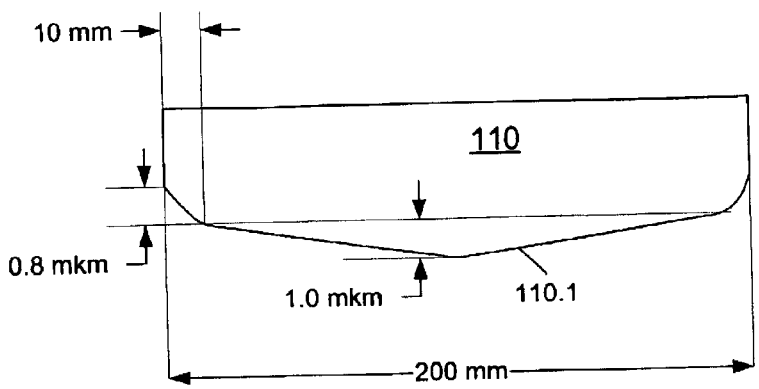
FIG. 8 is a side view of a wafer before processing by a plasma etch according to one embodiment of the present invention.

In one example, the system of FIGS. 5, 6A, 6B, 7 was used to process a 200 mm diameter wafer illustrated in FIG. 8. The wafer is shown before the edge underetch step 340. Surface 110.1 is convex due to the edge roll off and the non-uniformity near the center. Surface 110.1 projects downward by 0.8 $\mu$m in the 10 mm area adjacent to the edge, and then by additional 1.0 $\mu$m between the peripheral area and the center of the wafer.

Surface 110.1 was flat after processing. Thus, the wafer flatness and the thickness uniformity were improved throughout the wafer and not only at the edge.

The inner diameter of brim 630 was 202 mm at its narrowest point (at the bottom of the brim). Due to the centrifugal effect, the wafer was not exactly centered within the brim. The minimum distance between the wafer and the brim was about 30~60 mils (0.762~1.524 mm). The sign "~" indicates a range (i.e. 30 to 60 mils inclusive). The distance between the wafer bottom surface 110.1 and the bottom plate 460B was 60~80 mils (1.524~2.032 mm). The rotational velocity of the axis 530X with respect to the stationary axis 540X ranged from 20 to 400 mm/s, depending on the position of arm 540A relative to plasma generator 420. This velocity was controlled by drive 540. The angular velocity of the rotation around the axis 530X was 2~4 rps (revolutions per second). The angular velocity of the rotation around the axis 440 was 0.66~1.2 rpm (revolutions per minute).

Wafer holder 410 had 99 chucks 450, including 39 chucks at the periphery of the holder and 60 chucks closer to the center of the holder. Air was flown through the chucks at the rate 50~180 lpm (liters per minute). The total air flow into the five holders 410 in the carousel was thus 250~900 lpm.

The plasma current was 80~90 A. The plasma etch was a $CF_4$ etch, with the $CF_4$ flow being 3200~4500 ml/min. The average silicon etch rate was 1.75~2 $\mu$m/min.

Figure 9:
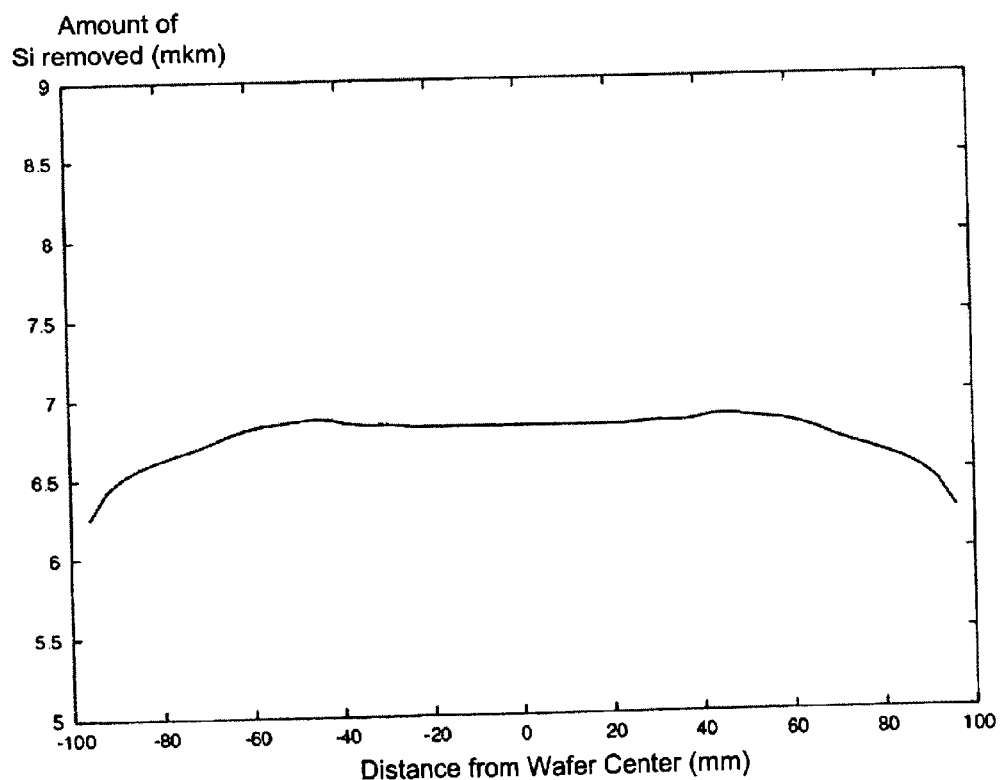
FIG. 9 is a graph showing the amount of material removed at different points of the wafer surface in a plasma etch according to one embodiment of the present invention.

FIG. 9 shows the amount of silicon removed at different points on the wafer surface. The horizontal coordinate is the distance from the wafer center, in millimeters. The vertical coordinate is the amount (thickness) of silicon removed from the wafer. The amount of silicon removed from the wafer decreases sharply near the wafer edge.

This implementation is exemplary and does not limit the invention. The invention is not limited by the embodiments, parameters, equipment, or steps described above. For example, steps 310–330 and 350 in FIG. 3 can be replaced with other step sequences, known or to be invented, and some of the steps can possibly be omitted. The vortex type holders 410 can be replaced with Bernoulli type holders. The invention is applicable to non-silicon wafers (e.g. GaAs). Other embodiments and variations are within the scope of the invention as defined by the appended claims.

What is claimed is:

1. A wafering method comprising:

holding a semiconductor wafer in a holder, wherein the wafer has a first surface facing a body of the holder and a second surface opposite to the first surface, and the holder emits gas from the body towards the first surface of the wafer to draw the wafer towards the body, wherein at least some of the gas is allowed to pass around the wafer's edge towards the second surface;

with the wafer in the holder, exposing the second surface of the wafer to a substance comprising a plasma in a wafering process, the substance etching the second surface;

wherein the second surface comprises a peripheral area adjacent to the wafer's edge and also comprises an area spaced from the wafer's edge; and the peripheral area is etched slower than the area spaced from the wafer's edge.

2. The method of claim 1 wherein the gas emitted by the holder comprises one or more gas vortices.

3. The method of claim 1 further comprising, during the etching of the second surface, conveying at least one rotational motion to the wafer around an axis passing through the wafer.

4. The method of claim 1 wherein the etching of the second surface occurs at an atmospheric pressure.

5. The method of claim 3 further comprising, during the etching of the second surface, conveying two additional rotational motions to the wafer around respective two additional axes.

6. The method of claim 1 wherein the etching of the second surface reduces an edge roll off of the second surface.

7. The method of claim 6 wherein the etching of the second surface eliminates the edge roll off of the second surface.

8. The method of claim 1 wherein the second surface is made flat by the etching.

9. The method of claim 1 wherein before the etching, the area spaced from the wafer's edge projects out relative to the peripheral area.

10. The method of claim 9 wherein the peripheral area is at least 10 mm wide.

11. The method of claim 1 wherein the etching of the second surface removes at least 1.0 $\mu$more of the wafer thickness in the area spaced from the wafer's edge than in the peripheral area.

12. The method of claim 1 wherein the etching of the second surface removes at least 1.8/0.8 times more of the wafer thickness in the area spaced from the wafer edge than in a portion of the peripheral area.

13. The method of claim 1 wherein the wafer is a silicon wafer.

* * * * *